United States Patent
Kim et al.

(10) Patent No.: US 10,886,404 B2
(45) Date of Patent: Jan. 5, 2021

(54) SEMICONDUCTOR DEVICE

(71) Applicant: SAMSUNG ELECTRONICS CO., LTD., Suwon-si (KR)

(72) Inventors: Sang Young Kim, Gyeonggi-do (KR); Deok Han Bae, Hwaseong-si (KR); Byung Chan Ryu, Seongnam-si (KR); Da Un Jeon, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 16/514,067

(22) Filed: Jul. 17, 2019

(65) Prior Publication Data

US 2019/0341492 A1 Nov. 7, 2019

Related U.S. Application Data

(63) Continuation of application No. 15/997,793, filed on Jun. 5, 2018, now Pat. No. 10,374,085.

(30) Foreign Application Priority Data

Nov. 15, 2017 (KR) .......................... 10-2017-0152071

(51) Int. Cl.
*H01L 29/78* (2006.01)
*H01L 21/768* (2006.01)
(Continued)

(52) U.S. Cl.
CPC .... *H01L 29/7835* (2013.01); *H01L 21/76804* (2013.01); *H01L 21/76816* (2013.01);
(Continued)

(58) Field of Classification Search
None
See application file for complete search history.

(56) References Cited

U.S. PATENT DOCUMENTS

| 6,072,242 A | 6/2000 | Son |
| 7,018,922 B1 | 3/2006 | Kim et al. |

(Continued)

FOREIGN PATENT DOCUMENTS

| JP | 11-040670 A | 2/1999 |
| JP | 2001-093974 A | 4/2001 |

(Continued)

*Primary Examiner* — Jack S Chen
(74) *Attorney, Agent, or Firm* — Lee IP Law, PC

(57) ABSTRACT

A semiconductor device includes a first active region that extends on a substrate in a first direction, a second active region that extends in parallel with the first active region, an element isolation region between the first and second active regions, a gate structure that extends in a second direction different from the first direction, and intersects the first and second active regions, a lower contact spaced apart from the gate structure in the first direction, the lower contact being on the first active region, the element isolation region, and the second active region, and an upper contact on the lower contact between the first active region and the second active region. A width of the lower contact in the first direction that is on the first active region m narrower than a width of the lower contact in the first direction that is on the element isolation region.

20 Claims, 11 Drawing Sheets

(51) Int. Cl.
*H01L 23/485* (2006.01)
*H01L 29/49* (2006.01)

(52) U.S. Cl.
CPC ...... *H01L 21/76846* (2013.01); *H01L 23/485* (2013.01); *H01L 29/4975* (2013.01); *H01L 29/78* (2013.01)

(56) References Cited

U.S. PATENT DOCUMENTS

| | | |
|---|---|---|
| 7,705,464 B2 | 4/2010 | Liaw et al. |
| 8,628,689 B2 | 1/2014 | Visser et al. |
| 9,006,826 B2 | 4/2015 | Lee |
| 2006/0202341 A1 | 9/2006 | Ito |
| 2019/0341492 A1* | 11/2019 | Kim .................. H01L 29/7835 |

FOREIGN PATENT DOCUMENTS

| | | |
|---|---|---|
| JP | 2010-010590 A | 1/2010 |
| KR | 10-2017-0054567 A | 5/2017 |
| WO | WO 2010-112605 A1 | 10/2010 |

* cited by examiner

SEMICONDUCTOR DEVICE

CROSS-REFERENCE TO RELATED APPLICATIONS

This is a continuation application based on pending application Ser. No. 15/997,793, filed Jun. 5, 2018, the entire contents of which is hereby incorporated by reference.

Korean Patent Application No. 10-2017-0152071, filed on Nov. 15, 2017, in the Korean Intellectual Property Office, and entitled: "Semiconductor Device," is incorporated by reference herein in its entirety.

BACKGROUND

1. Field

Embodiments relate to a semiconductor device.

2. Description of the Related Art

For semiconductor device density enhancement, the multigate transistor has been suggested as one of the scaling technologies, according to which a silicon body in a fin-like shape is formed on a substrate, with gates then being formed on the surface of the silicon body.

A multigate transistor may allow for increased scaling by using a three-dimensional channel. Further, current control capability may be enhanced without an increased gate length of the multigate transistor. Furthermore, it may be possible to suppress a short channel effect (SCE), which is the phenomenon that the electric potential of a channel region is influenced by a drain voltage.

SUMMARY

Embodiments are directed to a semiconductor device, including a first active region that extends on a substrate in a first direction, a second active region that extends on the substrate in the first direction and in parallel with the first active region, an element isolation region between the first active region and the second active region, a gate structure that extends in a second direction different from the first direction, and intersects the first and second active regions, a lower contact spaced apart from the gate structure in the first direction, the lower contact being on the first active region, the element isolation region, and the second active region, and an upper contact on the lower contact between the first active region and the second active region. A width of the lower contact in the first direction that is on the first active region m narrower than a width of the lower contact in the first direction that is on the element isolation region.

Embodiments are also directed to a semiconductor device, including a first active region that extends on a substrate in a first direction, a second active region that extends on the substrate in the first direction and in parallel with the first active region, an element isolation region between the first active region and the second active region, a first gate structure that extends in a second direction different from the first direction, and intersects the first and second active regions, a second gate structure that extends in the second direction and intersects the first and second active regions, the second gate structure being spaced apart from the first gate structure in the first direction, a lower contact that includes, between the first gate structure and the second gate structure, a first portion arranged on the first active region, a second portion arranged on the element isolation region, and a third portion arranged on the second active region, and an upper contact on the second portion of the lower contact, the upper contact having a width in the first direction that is narrower than a width of the second portion of the lower contact in the first direction. A width of the first portion of the lower contact in the first direction may be narrower than the width of the second portion of the lower contact in the first direction.

Embodiments are also directed to a semiconductor device, including first to fourth active regions that extend on a substrate in a first direction, respectively, and are spaced apart from one another in sequence in a second direction different from the first direction, a gate structure that extends in the second direction and intersects the first to fourth active regions, a first element isolation region between the first active region and the second active region, a second element isolation region between the second active region and the third active region, a third element isolation region between the third active region and the fourth active region, a lower contact spaced apart from the gate structure in the first direction, the lower contact being on the first to fourth active regions and the first to third element isolation regions, a first upper contact on the lower contact that overlaps the first element isolation region, a second upper contact on the lower contact that overlaps the second element isolation region, and a third upper contact on the lower contact that overlaps the third element isolation region. A width of the lower contact in the first direction that overlaps each of the first to fourth active regions may be narrower than a width of the lower contact in the first direction that overlaps each of the first to third element isolation regions

BRIEF DESCRIPTION OF THE DRAWINGS

Features will become apparent to those of skill in the art by describing in detail example embodiments with reference to the attached drawings in which.

DETAILED DESCRIPTION

Hereinbelow, a semiconductor device according to some example embodiments will be described with reference to FIG. 1 to FIG. 4.

Figure 1:
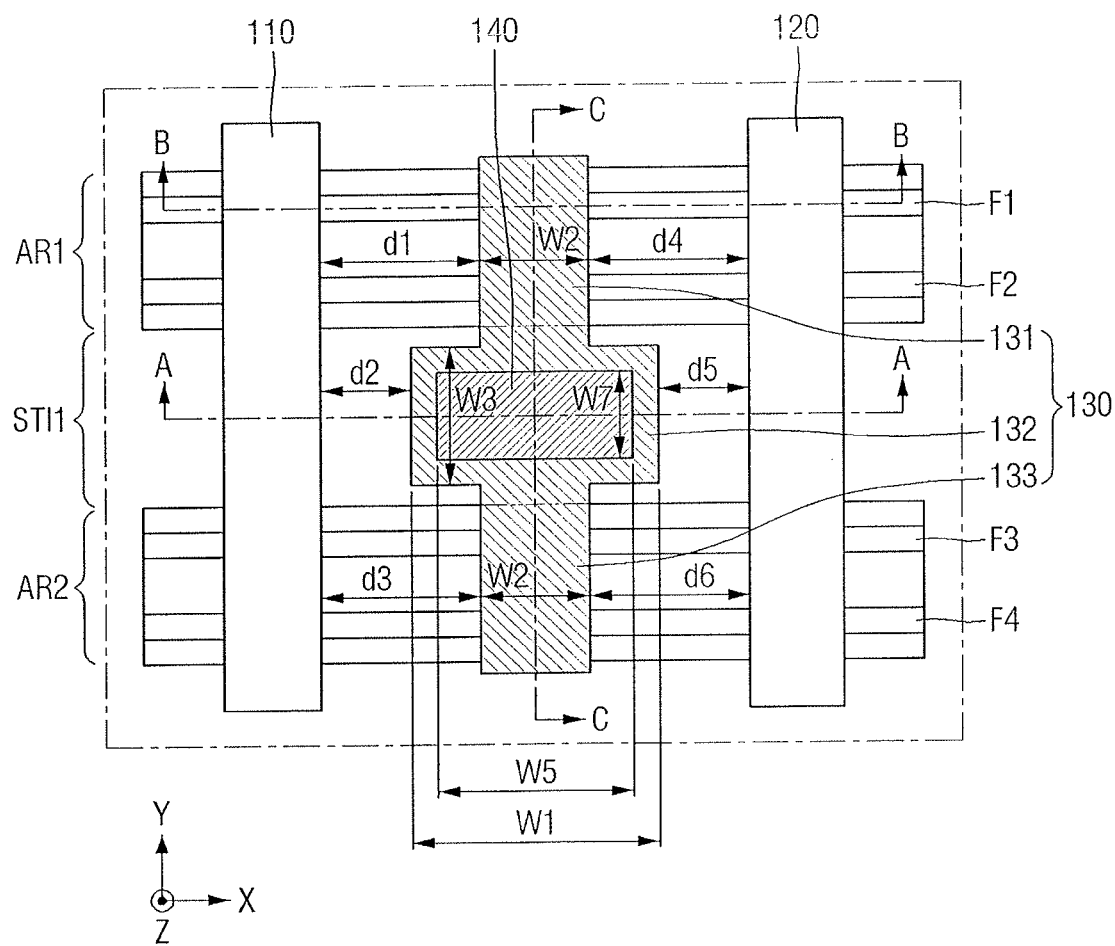
FIG. 1 illustrates a layout diagram provided to explain a semiconductor device according to some example embodiments.
Figure 2:
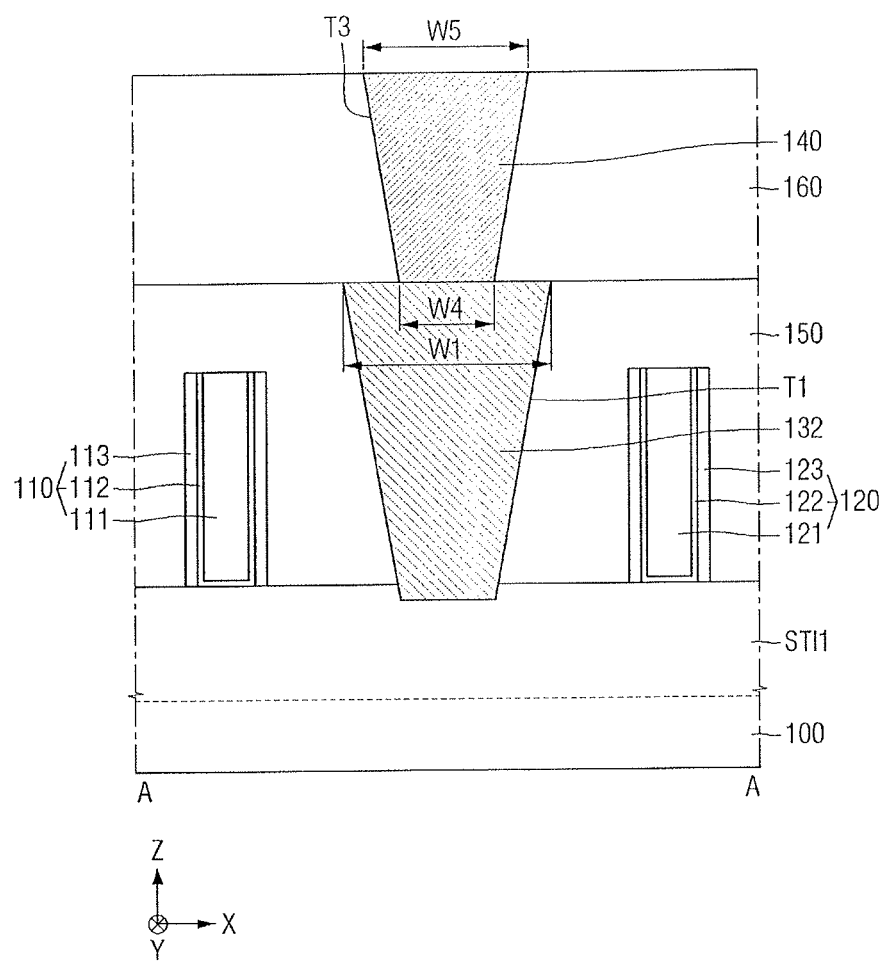
FIG. 2 illustrates a cross-sectional view taken on line A-A of FIG. 1.
Figure 3:
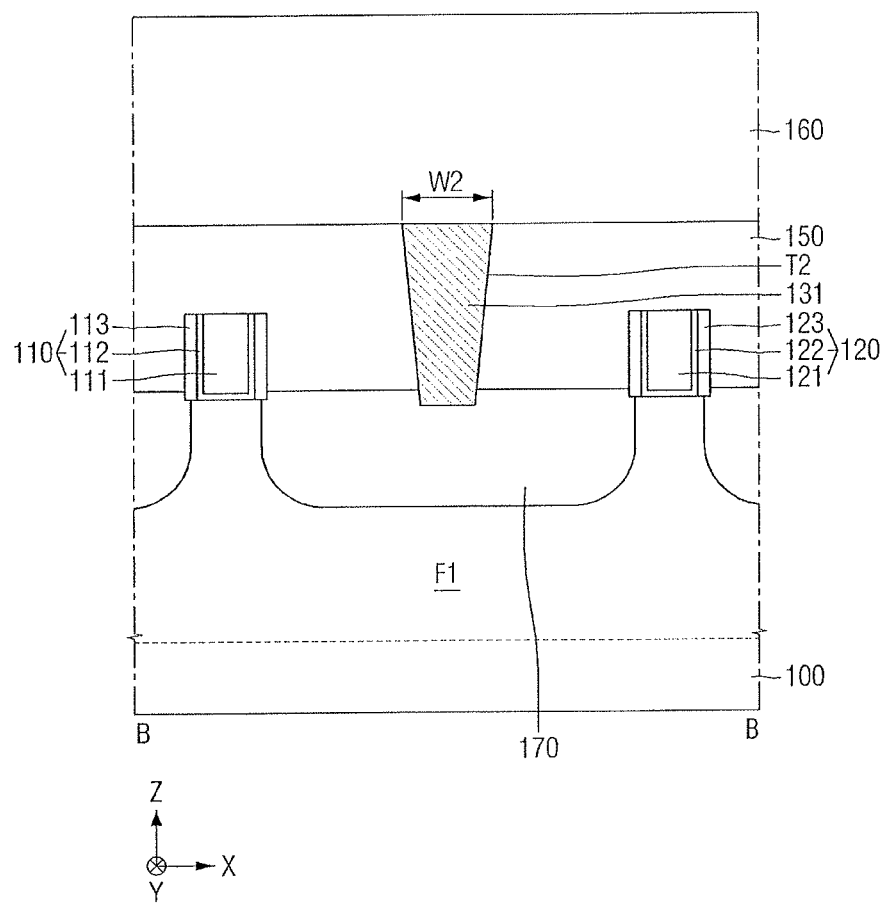
FIG. 3 illustrates a cross-sectional view taken on line B-B of FIG. 1.
Figure 4:
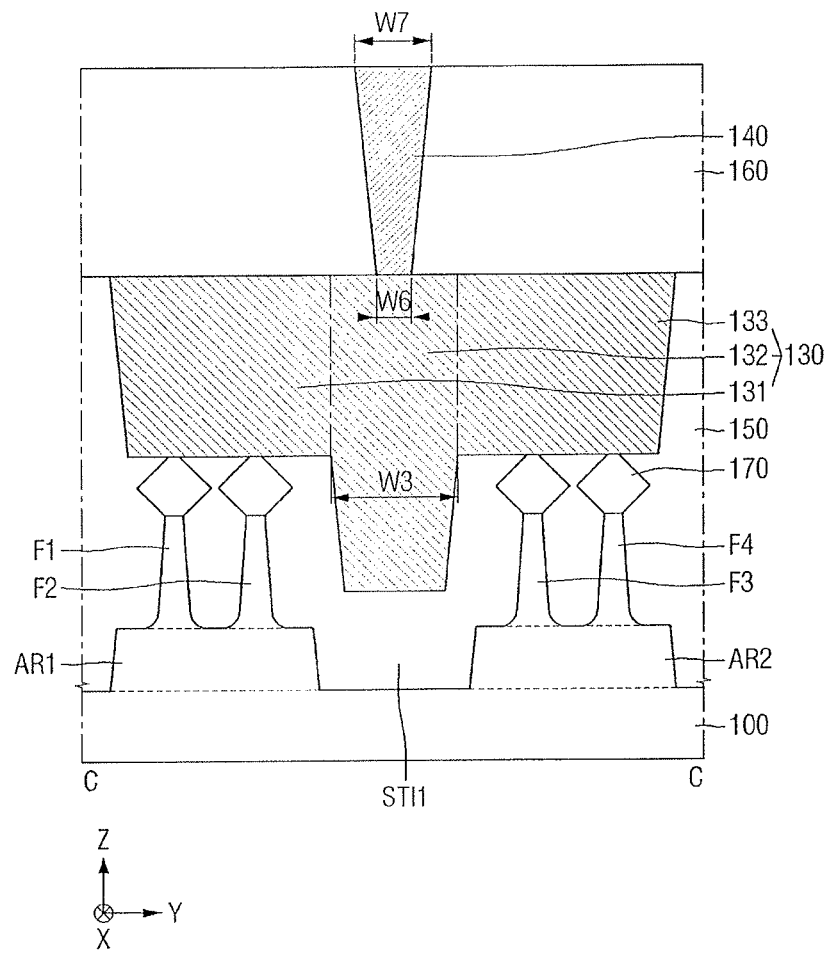
FIG. 4 illustrates a cross-sectional view taken on line C-C of FIG. 1.

FIG. 1 is a layout diagram provided to explain a semiconductor device according to some example embodiments. FIG. 2 is a cross-sectional view taken on line A-A of FIG. 1. FIG. 3 is a cross-sectional view taken on line B-B of FIG. 1. FIG. 4 is a cross-sectional view taken on line C-C of FIG. 1.

Referring to FIG. 1 to FIG. 4, a semiconductor device according to some example embodiments includes a substrate 100, a first active region AR1, a second active region AR2, a first element isolation region STI1, first to fourth fin-type patterns F1, F2, F3, and F4, a first gate structure 110, a second gate structure 120, a lower contact 130, an upper contact 140, a first interlayer insulating film 150, a second interlayer insulating film 160, and a source/drain region 170.

The substrate 100 may be, for example, a bulk silicon or a silicon-on-insulator (SOI), for example. In another implementation, the substrate 100 may be a silicon substrate, or may include other material such as silicon germanium, indium antimonide, lead telluride compound, indium arsenide, indium phosphide, gallium arsenide, or gallium antimonide. In another implementation, the substrate 100 may be a base substrate having an epitaxial layer formed thereon.

The first active region AR1 may be arranged on the substrate 100 to extend in a first direction X. The second active region AR2 may be arranged on the substrate 100 to extend in the first direction X and to be in parallel with the first active region AR1. Thus, the second active region AR2 may be arranged to be spaced apart from the first active region AR1 in a second direction Y.

The element isolation region STI1 may be arranged on the substrate 100 between the first active region AR1 and the second active region AR2.

The first fin-type pattern F1 and the second fin-type pattern F2 may be arranged on the first active region AR1 to extend in the first direction X and to protrude from the first active region AR1. The first fin-type pattern F1 and the second fin-type pattern F2 may be arranged to be spaced apart from each other in the second direction Y.

The third fin-type pattern F3 and the fourth fin-type pattern F4 may be arranged on the second active region AR2 to extend in the first direction X and to protrude from the second active region AR2. The third fin-type pattern F3 and the fourth fin-type pattern F4 may be arranged to be spaced apart from each other in the second direction Y.

Although FIG. 1 depicts that two fin-type patterns F1 and F2 are arranged on the first active region AR1, and two fin-type patterns F3 and F4 are arranged on the second active region AR2, this is merely for convenience of explanation, and the numbers of fin-type patterns arranged on the first active region AR1 and the second active region AR2, respectively, may be different.

The first to fourth fin-type patterns F1-F4 may be a portion of the substrate 100, and may include an epitaxial layer grown from the substrate 100. The first to fourth fin-type patterns F1-F4 may include the same material.

The first to fourth fin-type patterns F1-F4 may include, for example, an elemental semiconductor material such as silicon or germanium. Further, the first to fourth fin-type patterns F1-F4 may include a compound semiconductor such as IV-IV group compound semiconductor or III-V group compound semiconductor, for example.

For example, taking the IV-IV group compound semiconductor for example, the first to fourth fin-type patterns F1-F4 may be a binary compound or a ternary compound including at least two or more of carbon (C), silicon (Si), germanium (Ge) and tin (Sn), or these compounds doped with IV group element.

Taking the III-V group compound semiconductor for example, the first to fourth fin-type patterns F1-F4 may be one of a binary compound, a ternary compound, or a quaternary compound formed by combining a III group element which may be one or more of aluminum (Al), gallium (Ga), or indium (In), with a V group element which may be one of phosphorus (P), arsenic (As), or antimony (Sb).

In the following description, it is assumed that the first to fourth fin-type patterns F1-F4 include silicon.

The first gate structure 110 may be arranged on the first active region AR1, the element isolation region STI1, and the second active region AR2 to extend in the second direction Y. Thus, the first gate structure 110 may be arranged to intersect with the first active region AR1, the element isolation region STI1, and the second active region AR2.

The first gate structure 110 may include a first gate electrode 111, a first gate insulating film 112, and a first gate spacer 113.

The first gate electrode 111 may extend in the second direction Y to be arranged on the first to fourth fin-type patterns F1-F4 and the element isolation region STI1. The first gate electrode 111 may entirely intersect with the first to fourth fin-type patterns F1-F4.

The first gate electrode 111 may include, for example, a metal layer. Although FIG. 2 and FIG. 3 depict that the first gate electrode 111 is a single layer, in some example embodiments, the first gate electrode 111 may include, for example, two or more metal layers stacked one on the other.

The first gate electrode 111 may be formed by, for example, a replacement process (or gate last process).

The first gate insulating film 112 may be arranged between the first to the fourth fin-type patterns F1-F4 and the first gate electrode 111. The first gate insulating film 112 may be arranged between the element isolation region STI1 and the first gate electrode 111. The first gate insulating film 112 may be arranged between the first gate spacer 113 and the first gate electrode 111.

The first gate insulating film 112 may include, for example, silicon oxide, silicon oxynitride, silicon nitride, a high-k dielectric material with a higher dielectric constant than silicon oxide, etc. The high-k dielectric material may include, for example, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The first gate spacer 113 may be formed on a sidewall of the first gate electrode 111 extending in the second direction Y. The first gate spacer 113 may include, for example, one or more of silicon nitride (SiN), silicon oxynitride (SiON), silicon oxide ($SiO_2$), or silicon oxycarbonitride (SiOCN).

The second gate structure 120 may be spaced apart from the first gate structure 110 in the first direction X, and may be arranged on the first active region AR1, the element isolation region STI1, and the second active region AR2 to extend in the second direction Y. Thus, the second gate structure 120 may be arranged to intersect with the first active region AR1, the element isolation region STI1, and the second active region AR2.

The second gate structure 120 may include a second gate electrode 121, a second gate insulating film 122, and a second gate spacer 123.

The second gate electrode 121 may extend in the second direction Y to be arranged on the first to fourth fin-type patterns F1-F4 and the element isolation region STI1. The second gate electrode 121 may entirely intersect with the first to fourth fin-type patterns F1-F4.

The second gate electrode 121 may include a metal layer. Although FIG. 2 and FIG. 3 depict that the second gate electrode 121 is a single layer, the second gate electrode 121 may include, for example, two or more metal layers stacked one on the other.

The second gate electrode 121 may be formed by, for example, a replacement process (or gate last process).

The second gate insulating film 122 may be arranged between the first to the fourth fin-type patterns F1-F4 and the second gate electrode 121. The second gate insulating film 122 may be arranged between the element isolation region STI1 and the second gate electrode 121. The second gate insulating film 122 may be arranged between the second gate spacer 123 and the second gate electrode 121.

The second gate insulating film 122 may include, for example, one or more of silicon oxide, silicon oxynitride, silicon nitride, or a high-k dielectric material with a higher dielectric constant than silicon oxide. The high-k dielectric material may include, for example, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The second gate spacer 123 may be formed on a sidewall of the second gate electrode 121 extending in the second direction Y. The second gate spacer 123 may include, for example, one or more of silicon nitride (SiN), silicon oxynitride (SiON), silicon oxide (SiO$_2$), or silicon oxycarbonitride (SiOCN).

The first interlayer insulating film 150 may be arranged to cover the first to fourth fin-type patterns F1-F4, the first gate structure 110, the second gate structure 120, the element isolation region STI1, and the source/drain region 170.

The first interlayer insulating film 150 may include a first trench T1 that penetrates through the first interlayer insulating film 150 on the element isolation region STI1, and a second trench T2 that penetrates through the first interlayer insulating film 150 on the first and second active regions AR1 and AR2. The first trench T1 and the second trench T2 may be formed between the first gate structure 110 and the second gate structure 120.

The second interlayer insulating film 160 may be arranged on the first interlayer insulating film 150. The second interlayer insulating film 160 may include a third trench T3 that penetrates through the second interlayer insulating film 160 on the element isolation region STI1. The third trench T1 may be formed between the first gate structure 110 and the second gate structure 120.

Each of the first interlayer insulating film 150 and the second interlayer insulating film 160 may include, for example, one or more of silicon oxide, silicon nitride, silicon oxynitride, or a low-k dielectric material with a smaller dielectric constant than silicon oxide. The low-k dielectric material may include, for example, flowable oxide (FOX), torene silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, or porous polymeric material.

The source/drain region 170 may be formed on both sides of the first gate structure 110 and on both sides of the second gate structure 120.

The source/drain region 170 may include an epitaxial layer formed by an epitaxy process. The source/drain region 170 may be an elevated source/drain.

When the source/drain region 170 is formed in a P-type metal oxide semiconductor (PMOS) region, the source/drain region 170 may be, for example, a SiGe epitaxial layer. When the source/drain region 170 is formed in a N-type metal oxide semiconductor (NMOS) region, the source/drain region 170 may be, for example, a Si epitaxial layer. In this case, the source/drain region 170 may include SiP highly doped with P.

The lower contact 130 may be arranged inside the first trench T1 and the second trench T2. A portion of the lower contact 130 that is arranged inside the first trench T1 may be arranged on the element isolation region STI1. A portion of the lower contact 130 that is arranged inside the second trench T2 may be arranged on the source/drain region 170. In this case, the lower contact 130 arranged on the source/drain region 170 may include a silicide film.

The lower contact 130 arranged on the first active region AR1 may be in contact with the source/drain region 170 formed on the first and second fin-type patterns F1 and F2. The lower contact 130 arranged on the second active region AR2 may be in contact with the source/drain region 170 formed on the third and fourth fin-type patterns F3 and F4.

Although FIG. 2 to FIG. 4 depict that the lower contact 130 is a single layer, this is merely for convenience of explanation, and in some example embodiments the lower contact 130 may include a plurality of layers. For example, the lower contact 130 may include a lower contact barrier film that is arranged along an inner wall of each of the first trench T1 and the second trench T2, and a lower contact filling film that is on the lower contact barrier film to fill each of the first trench T1 and the second trench T2.

In this case, the lower contact barrier film may include, for example, one or more of tantalum (Ta), tantalum nitride (TaN), titanium (Ti), titanium nitride (TiN), ruthenium (Ru), cobalt (Co), nickel (Ni), nickel boride (NiB), or tungsten nitride (WN).

In addition, the lower contact filling film may include, for example, one or more of aluminum (Al), tungsten (W), copper (Cu), cobalt (Co), or doped polysilicon.

The lower contact 130 may be arranged between the first gate structure 110 and the second gate structure 120 to be spaced apart from the first gate structure 110 and the second gate structure 120, respectively, in the first direction X.

The lower contact 130 may include a first portion 131 arranged on the first active region AR1, a second portion 132 arranged on the element isolation region STI1, and a third portion 133 arranged on the second active region AR2.

A width W2 of the first portion 131 of the lower contact 130 in the first direction X may be narrower than a width W1 of the second portion 132 of the lower contact 130 in the first direction X. Further, a width W2 of the third portion 133 of the lower contact 130 in the first direction X may be narrower than the width W1 of the second portion 132 of the lower contact 130 in the first direction X.

In this case, the width W2 of the first portion 131 of the lower contact 130 in the first direction X may be the same as the width of the third portion 133 of the lower contact 130 in the first direction X.

The second portion 132 of the lower contact 130 may be formed to protrude in a direction in which the first gate structure 110 is positioned, for example, in the first direction X. In addition, the second portion 132 of the lower contact 130 may be formed to protrude in a direction in which the second gate structure 120 is positioned, for example, in the first direction X.

For example, a first distance d1 between the first portion 131 of the lower contact 130 and the first gate structure 110 may be greater than a second distance d2 between the second portion 132 of the lower contact 130 and the first gate structure 110. A third distance d3 between the third portion 133 of the lower contact 130 and the first gate structure 110 may be greater than the second distance d2 between the second portion 132 of the lower contact 130 and the first gate structure 110. In this case, the first distance d1 and the third distance d3 may be the same. In some example embodiments, the first distance d1 and the third distance d3 may be different from each other.

A fourth distance d4 between the first portion 131 of the lower contact 130 and the second gate structure 120 may be greater than a fifth distance d5 between the second portion 132 of the lower contact 130 and the second gate structure 120. A sixth distance d6 between the third portion 133 of the lower contact 130 and the second gate structure 120 may be greater than the fifth distance d5 between the second portion 132 of the lower contact 130 and the second gate structure 120. In this case, the fourth distance d4 and the sixth distance d6 may be the same. In some example embodiments, the fourth distance d4 and the sixth distance d6 may be different from each other.

In some example embodiments, the first distance d1 and the fourth distance d4 may be the same, the second distance d2 and the fifth distance d5 may be the same, and the third distance d3 and the sixth distance d6 may be the same.

As illustrated in FIG. 4, the second portion 132 of the lower contact 130 may be formed to be deeper toward the substrate 100 in a third direction Z than the first portion 131 of the lower contact 130 and the third portion 133 of the lower contact 130.

The upper contact 140 may be arranged inside the third trench T3. The upper contact 140 may be arranged on the lower contact 130 between the first active region AR1 and the second active region AR2. Thus, the upper contact 140 may be arranged on the second portion 132 of the lower contact 130. The upper contact 140 may be in contact with the second portion 132 of the lower contact 130.

As illustrated in FIG. 1, the upper contact 140 may be arranged to be spaced apart from the first active region AR1 and the second active region AR2, respectively, in the second direction Y. In some example embodiments, the upper contact 140 may be arranged on a boundary line between the first active region AR1 and the element isolation region STI1, and on a boundary line between the second active region AR2 and the element isolation region STI1.

Although FIG. 2 and FIG. 4 depict that the upper contact 140 is a single layer, this is merely for convenience of explanation, and in some example embodiments the upper contact 140 may include a plurality of layers. For example, the upper contact 140 may include an upper contact barrier film that is arranged along an inner wall of the third trench T3, and an upper contact filling film that is on the upper contact barrier film to fill the third trench T3.

In this case, the upper contact barrier film may include, for example, one or more of tantalum (Ta), tantalum nitride (TaN), titanium (Ti), titanium nitride (TiN), ruthenium (Ru), cobalt (Co), nickel (Ni), nickel boride (NiB), or tungsten nitride (WN).

In addition, the upper contact filling film may include, for example, one or more of aluminum (Al), tungsten (W), copper (Cu), cobalt (Co), or doped polysilicon.

The upper contact 140 may be arranged between the first gate structure 110 and the second gate structure 120 to be spaced apart from the first gate structure 110 and the second gate structure 120, respectively, in the first direction X.

As illustrated in FIG. 2, a width of the upper contact 140 in the first direction X may be narrower than the width W1 of the second portion 132 of the lower contact 130 in the first direction X.

For example, a width W4 of a lower surface of the upper contact 140 in the first direction X that is in contact with the second portion 132 of the lower contact 130 may be narrower than the width W1 of the second portion 132 of the lower contact 130 in the first direction X. A width W5 of an upper surface of the upper contact 140 in the first direction X may be narrower than the width W1 of the second portion 132 of the lower contact 130 in the first direction X. The width W5 of the upper surface of the upper contact 140 in the first direction X may be wider than the width W4 of the lower surface of the upper contact 140 in the first direction X. In other example embodiments, the width W5 of the upper surface of the upper contact 140 in the first direction X may be the same as the width W1 of the second portion 132 of the lower contact 130 in the first direction X.

As illustrated in FIG. 4, a width of the upper contact 140 in the second direction Y may be narrower than a width W3 of the second portion 132 of the lower contact 130 in the second direction Y.

For example, a width W6 of the lower surface of the upper contact 140 in the second direction Y that is in contact with the second portion 132 of the lower contact 130 may be narrower than the width W3 of the second portion 132 of the lower portion of the lower contact 130 in the second direction Y. A width W7 of the upper surface of the upper contact 140 in the second direction Y may be narrower than the width W3 of the second portion 132 of the lower portion of the lower contact 130 in the second direction Y.

In other example embodiments, the width W7 of the upper surface of the upper contact 140 in the second direction Y may be the same as the width W3 of the second portion 132 of the lower contact 130 in the second direction Y. In addition, in some example embodiments, the width W7 of the upper surface of the upper contact 140 in the second direction Y may be wider than or equal to the width W6 of the lower surface of the upper contact 140 in the second direction Y.

In the semiconductor device according to some example embodiments, the distances d1, d3, d4, and d6 between the gate structures 110 and 120 and the first and third portions 131, 133 of the lower contact 130 arranged on the first and second active regions AR1 and AR2 may be greater than the distances d2 and d5 between the gate structures 110 and 120 and the second portion 132 of the lower contact 130 arranged on the element isolation region STI1, such that a margin may be guaranteed between the gate structure 110 and the lower contact 130 and thus reliability of the semiconductor device may be enhanced.

In addition, in the semiconductor device according to some example embodiments, the width W5 of the upper contact 140 arranged on the element isolation region STI1 may be narrower than the width W1 of the second portion 132 of the lower contact 130 arranged on the element isolation region STI1, such that a margin for forming the upper contact 140 may be guaranteed and thus reliability of the semiconductor device may be enhanced.

Hereinbelow, a method for fabricating a semiconductor device according to some example embodiments will be described with reference to FIG. 5 to FIG. 10.

FIG. 5 to FIG. 10 are views illustrating intermediate stages of fabrication, provided to explain a method for fabricating a semiconductor device according to some example embodiments.

Figure 5:
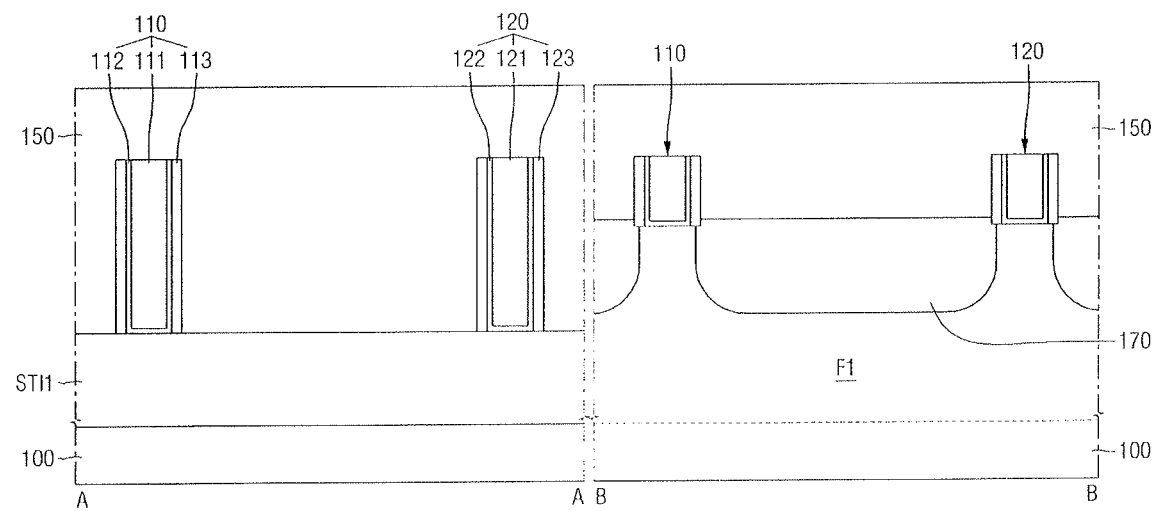
FIG. 5 to FIG. 10 illustrate views illustrating intermediate stages of fabrication, provided to explain a method for fabricating a semiconductor device according to some example embodiments.

Referring to FIG. 5, a first element isolation region STI1, the first fin-type pattern F1, the first gate structure 110, the second gate structure 120, the source/drain region 170, and the first interlayer insulating film 150 may be formed on the substrate 100.

The first gate structure 110 may include the first gate electrode 111, the first gate insulating film 112, and the first gate spacer 113. The second gate structure 120 may include a second gate electrode 121, a second gate insulating film 122, and a second gate spacer 123.

Figure 6:
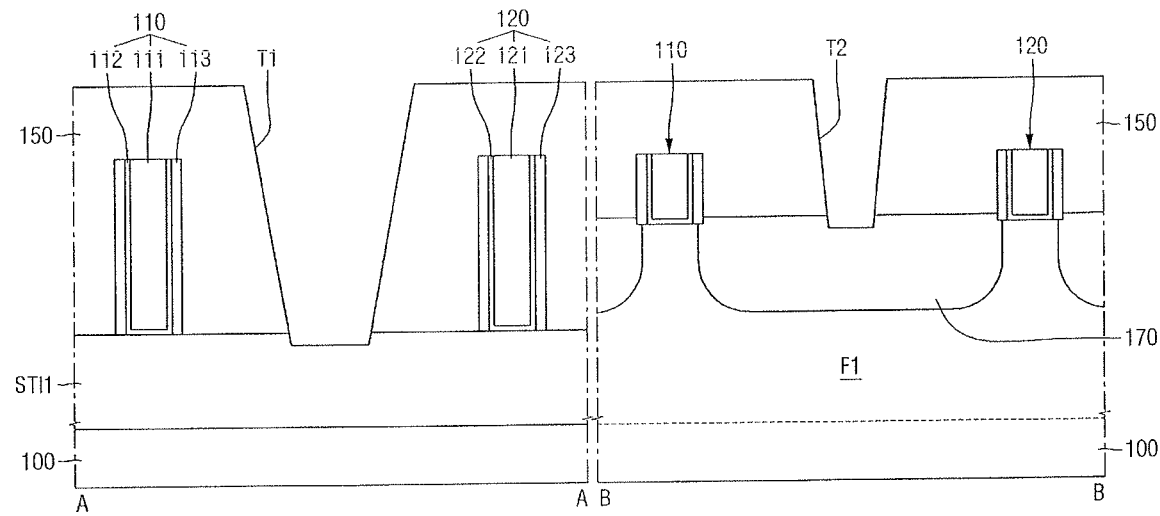

Referring to FIG. 6, the first trench T1 penetrating through the first interlayer insulating film 150 may be formed by etching a portion of the first interlayer insulating film 150 formed on the element isolation region STI1 and a portion of the element isolation region STI1.

In addition, the second trench T2 penetrating through the first interlayer insulating film 150 may be formed by etching a portion of the first interlayer insulating film 150 and a portion of the source/drain region 170 which are formed on the first fin-type pattern F1.

In this case, a width of the first trench T1 may be wider than a width of the second trench T2.

Figure 7:
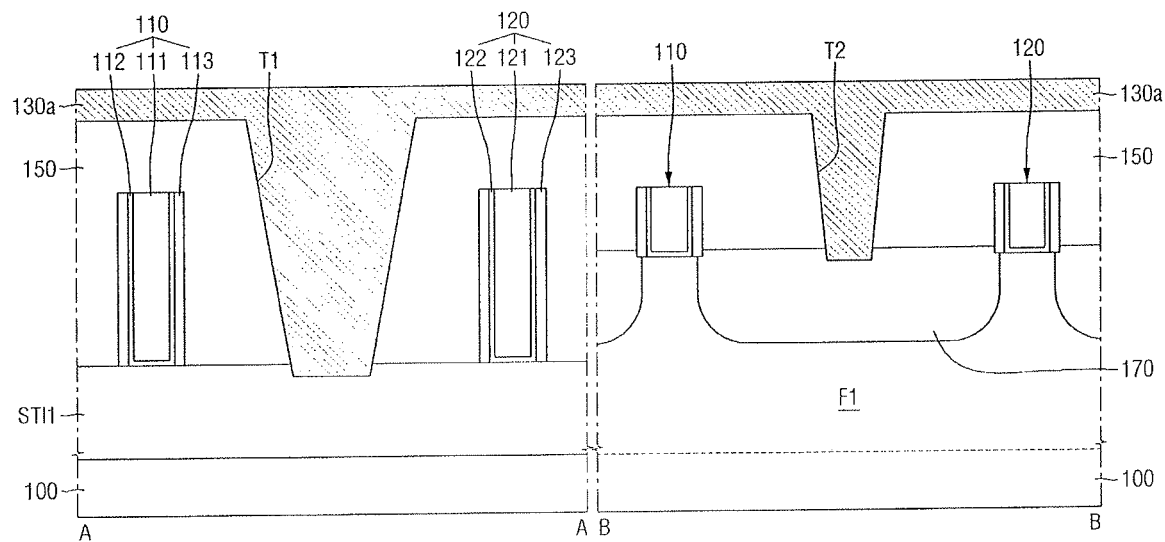

Referring to FIG. 7, a lower contact film 130a may be formed on an upper surface of the first interlayer insulating film 150, an inside of the first trench T1, and an inside of the second trench T2. In this case, the lower contact film 130a may be formed to completely fill the inside of the first trench T1 and the inside of the second trench T2, respectively.

Figure 8:
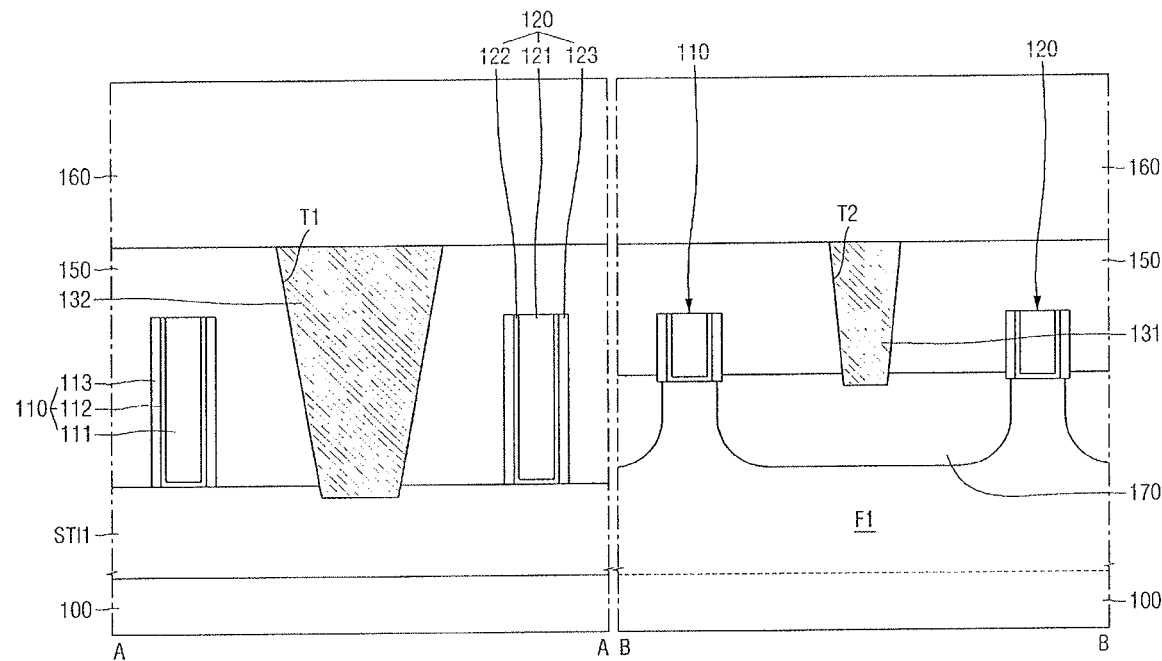

Referring to FIG. 8, the upper surface of the first interlayer insulating film 150 may be exposed through a smoothing process (for example, a chemical mechanical polishing (CMP) process). Consequently, the second portion 132 of the lower contact (130 of FIG. 1) may be formed inside the first trench T1, and the first portion 131 of the lower contact (130 of FIG. 1) may be formed inside the second trench T2.

Next, the second interlayer insulating film 160 may be formed to cover the upper surface of the first interlayer insulating film 150, the upper surface of the second portion 132 of the lower contact (130 of FIG. 1), and the upper surface of the first portion 131 of the lower contact (130 of FIG. 1).

Figure 9:
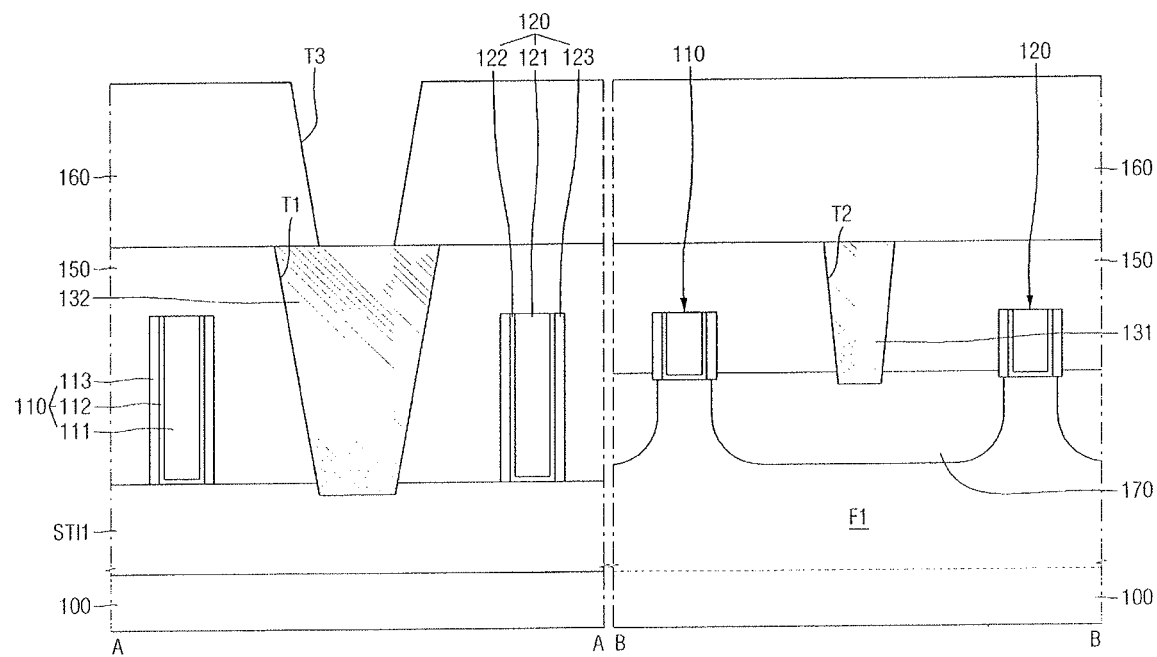

Referring to FIG. 9, the third trench T3 penetrating through the second interlayer insulating film 160 may be formed by etching the second interlayer insulating film 160 formed on the second portion 132 of the lower contact (130 of FIG. 1).

In this case, a width of the upper surface of the third trench T3 may be narrower than a width of the upper surface of the first trench T1.

Figure 10:
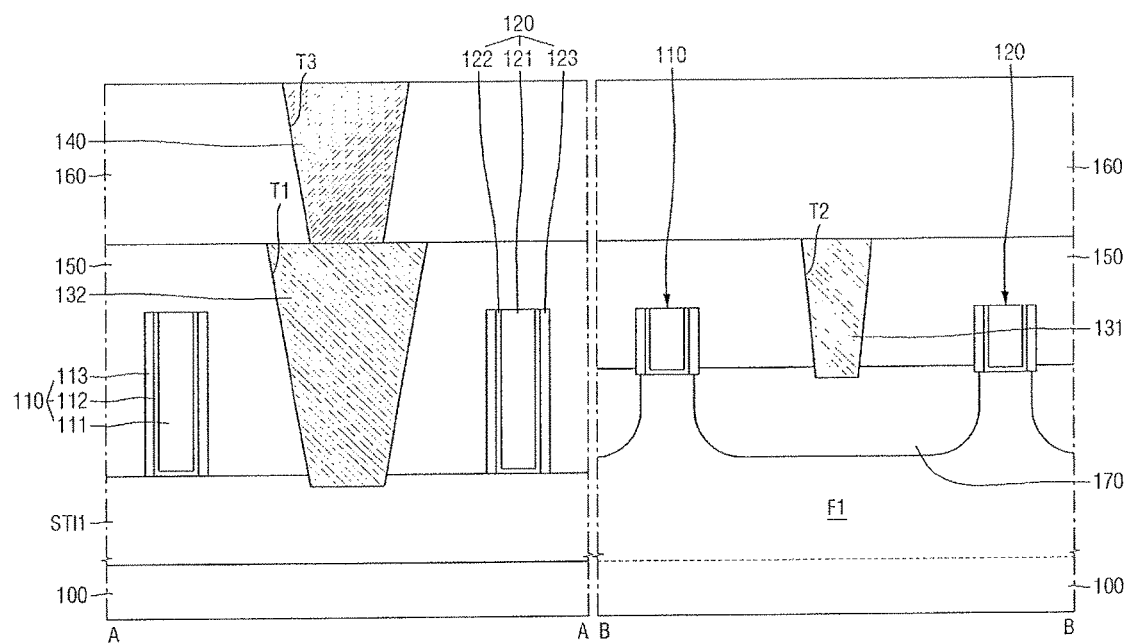

Referring to FIG. 10, an upper contact film may be formed on the upper surface of the second interlayer insulating film 160 and the inside of the third trench T3. In this case, the upper contact film may be formed to completely fill the inside of the third trench T3.

Next, the upper surface of the second interlayer insulating film 160 may be exposed through a smoothing process (for example, a CMP process). Consequently, the upper contact 140 may be formed inside the third trench T3.

Hereinbelow, a semiconductor device according to some example embodiments will be described with reference to FIG. 11. The difference from the semiconductor device illustrated in FIG. 1 will be highlighted.

Figure 11:
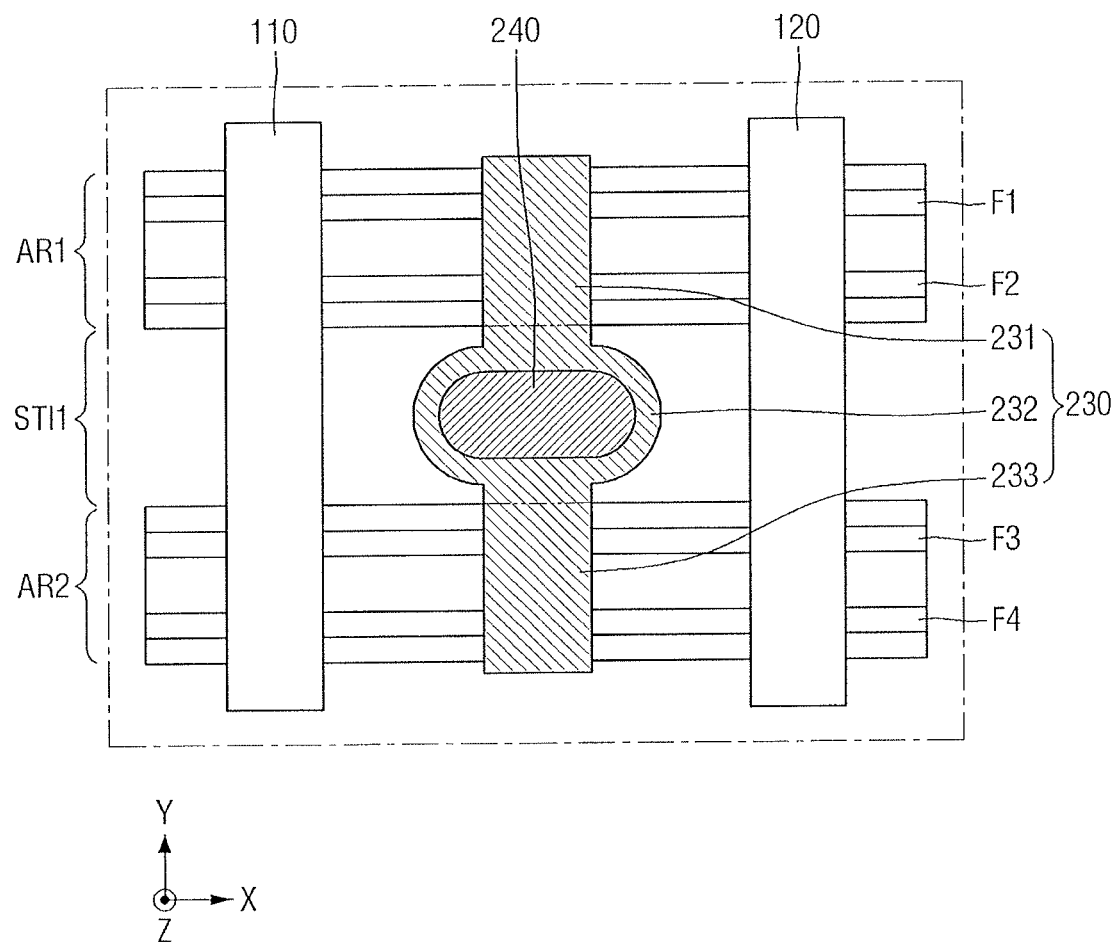
FIG. 11 illustrates a layout diagram provided to explain a semiconductor device according to some example embodiments.

FIG. 11 is a layout diagram provided to explain a semiconductor device according to some example embodiments.

Referring to FIG. 11, a semiconductor device according to some example embodiments may include a lower contact 230 including a first portion 231 arranged on the first active region AR1, a second portion 232 arranged on the element isolation region STI1, and a third portion 233 arranged on the second active region AR2.

The second portion 232 of the lower contact 230 arranged on the element isolation region STI1 may have convex portions that respectively protrude toward the first and second gate structures 110 and 120. Thus, sidewalls of the second portion 232 of the lower contact 230 facing the first and second gate structures 110 and 120, respectively, may each have a curved shape convexly formed.

Sidewalls of an upper contact 240 facing the first and second gate structures 110 and 120, respectively, may each also have a curved shape convexly formed. In some example embodiments, the upper contact 240 may have a rectangular shape like the semiconductor device illustrated in FIG. 1.

Hereinbelow, a semiconductor device according to some example embodiments will be described with reference to FIG. 12. The difference from the semiconductor device illustrated in FIG. 1 will be highlighted.

Figure 12:
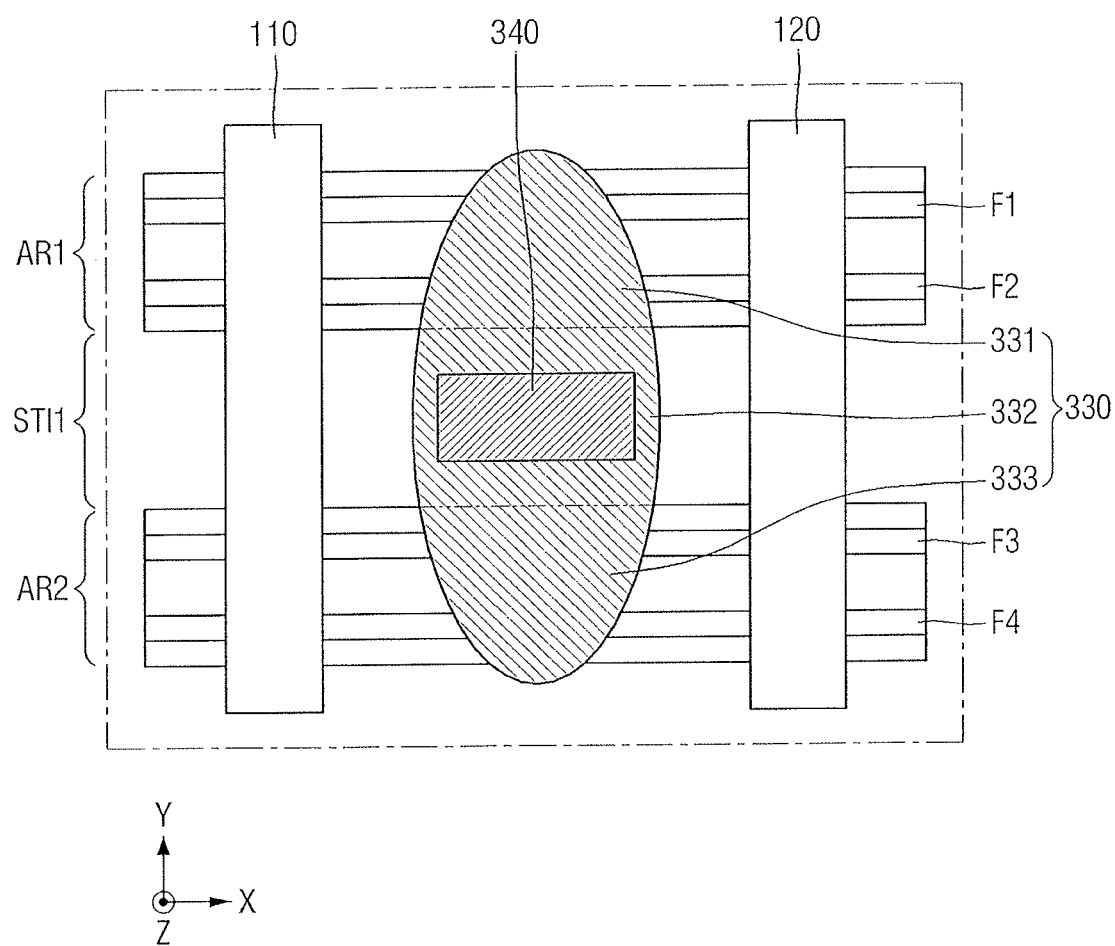
FIG. 12 illustrates a layout diagram provided to explain a semiconductor device according to some example embodiments.

FIG. 12 is a layout diagram provided to explain a semiconductor device according to some example embodiments.

Referring to FIG. 12, a semiconductor device according to some example embodiments may include a lower contact 330 including a first portion 331 arranged on the first active region AR1, a second portion 332 arranged on the element isolation region STI1, and a third portion 333 arranged on the second active region AR2.

A plane of the lower contact 330 formed in parallel with a plane on which the substrate (100 of FIG. 2) is arranged may have an oval shape.

An upper contact 340 may have a rectangular shape like the semiconductor device illustrated in FIG. 1. In some example embodiments, sidewalls of the upper contact 340 facing the first and second gate structures 110 and 120, respectively, may each have a curved shape convexly formed.

Hereinbelow, a semiconductor device according to some example embodiments will be described with reference to FIG. 13. The difference from the semiconductor device illustrated in FIG. 1 will be highlighted.

Figure 13:
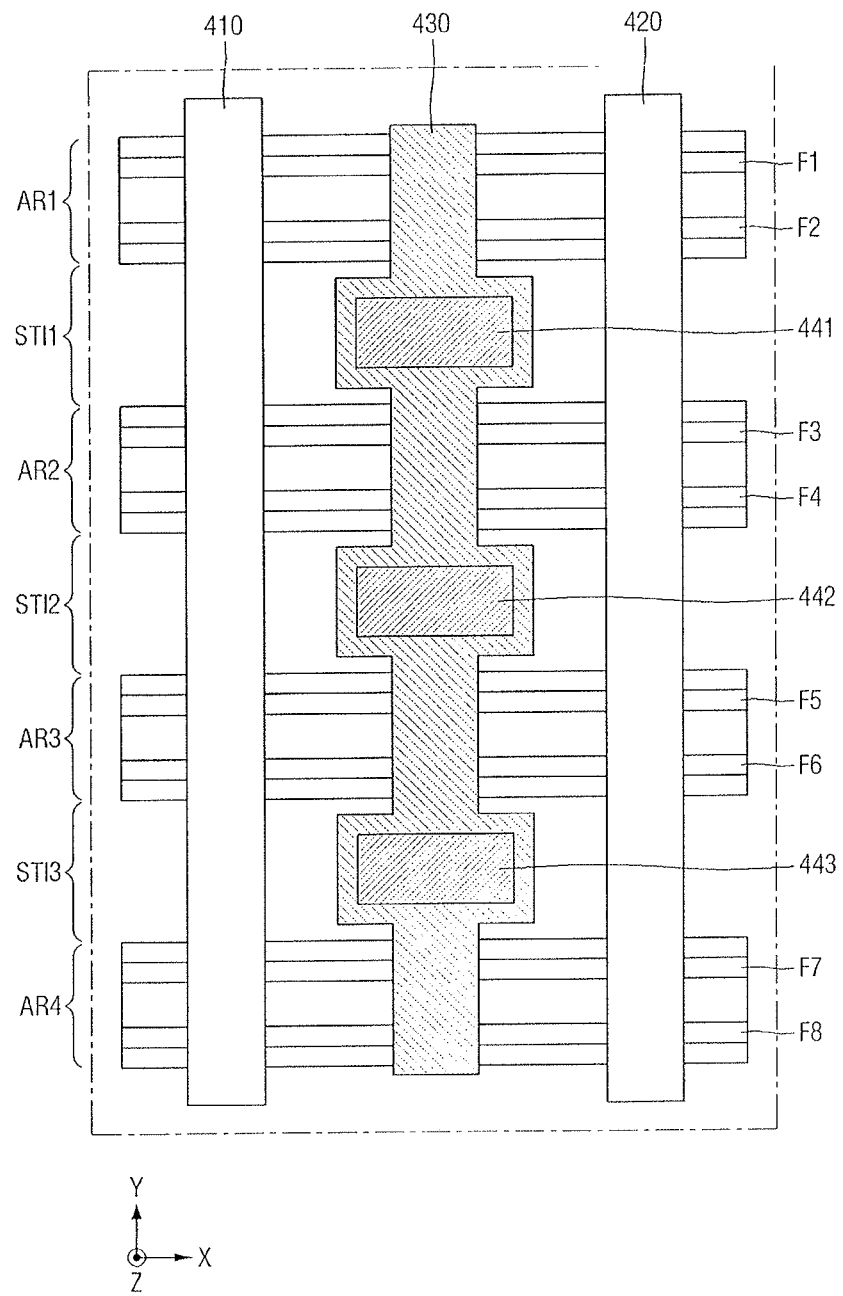
FIG. 13 illustrates a layout diagram provided to explain a semiconductor device according to some example embodiments.

FIG. 13 is a layout diagram provided to explain a semiconductor device according to some example embodiments.

Referring to FIG. 13, a semiconductor device according to some example embodiments may include first to fourth active regions AR1, AR2, AR3, and AR4 which extend on the substrate (100 of FIG. 2) in the first direction X, respectively, and are arranged to be spaced apart from one another in sequence in the second direction Y.

A first element isolation region STI1 may be arranged between the first active region AR1 and the second active region AR2, a second element isolation region STI2 may be arranged between the second active region AR2 and the third active region AR3, and a third element isolation region STI3 may be arranged between the third active region AR3 and the fourth active region AR4.

A first fin-type pattern F1 and a second fin-type pattern F2 may be arranged on the first active region AR1, a third fin-type pattern F3 and a fourth fin-type pattern F4 may be arranged on the second active region AR2, a fifth fin-type pattern F5 and a sixth fin-type pattern F6 may be arranged on the third active region AR3, and a seventh fin-type pattern F7 and an eighth fin-type pattern F8 may be arranged on the fourth active region AR4.

The first to eighth fin-type patterns F1-F8 may be arranged to extend in the first direction X, respectively.

A first gate structure 410 and a second gate structure 420 may be arranged to be spaced apart from each other in the first direction X, and to extend in the second direction Y to intersect with the first to fourth active regions AR1-AR4 and the first to third element isolation regions STI1-STI3.

A lower contact 430 may be arranged between the first gate structure 410 and the second gate structure 420 to be spaced apart from the first gate structure 410 and the second gate structure 420, respectively, in the first direction X.

The lower contact 430 may be arranged on the first to fourth active regions AR1-AR4 and the first to third element isolation regions STI1-STI3.

The lower contact 430 arranged on the first to third element isolation regions STI1-STI3 may have portions convexly formed toward a direction in which the first gate structure 410 is positioned. In addition, the lower contact 430 arranged on the first to third element isolation regions STI1-STI3 may have portions convexly formed toward a direction in which the second gate structure 420 is positioned.

A width of the lower contact 430 in the first direction X that overlaps each of the first to fourth active regions AR1-AR4 may be narrower than a width of the lower contact 430 in the first direction X that overlaps each of the first to third element isolation regions STI1-STI3.

A distance between the first gate structure 410 and the lower contact 430 on the first to fourth active regions AR1-AR4 may be greater than a distance between the first gate structure 410 and the lower contact 430 on the first to third element isolation regions STI1-STI3.

A first upper contact 441 may be arranged on the lower contact 430 that overlaps the first element isolation region STI1. A second upper contact 442 may be arranged on the lower contact 430 that overlaps the second element isolation region STI2. A third upper contact 443 may be arranged on the lower contact 430 that overlaps the third element isolation region STI3.

A width of each of the first to third upper contacts 441, 442, and 443 in the first direction X may be narrower than a width of the lower contact 430 in the first direction X that is on the first to third element isolation regions STI1-STI3.

Hereinbelow, a semiconductor device according to some example embodiments will be described with reference to FIG. 14. The difference from the semiconductor device illustrated in FIG. 13 will be highlighted.

Figure 14:
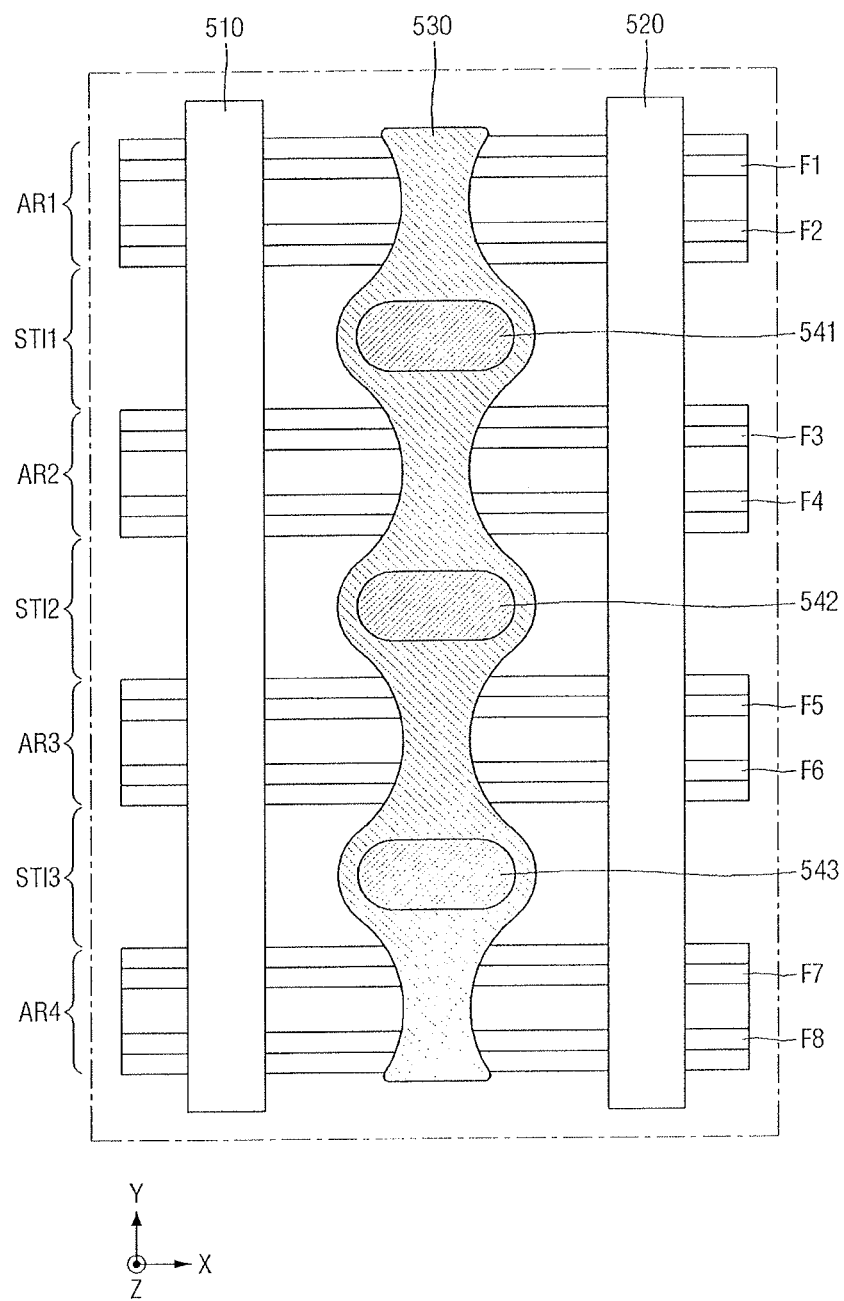
FIG. 14 illustrates a layout diagram provided to explain a semiconductor device according to some example embodiments.

FIG. 14 is a layout diagram provided to explain a semiconductor device according to some example embodiments.

Referring to FIG. 14, in a semiconductor device according to some example embodiments, a sidewall of a lower contact 530 arranged on the first to fourth active regions AR1-AR4 and facing a first gate structure 510 may have a curved shape which is concavely indented in the opposite direction of a direction of facing the first gate structure 510.

In addition, a sidewall of the lower contact 530 arranged on the first to fourth active regions AR1-AR4 and facing a second gate structure 520 may have a curved shape which is concavely indented in the opposite direction of a direction of facing the second gate structure 520.

A sidewall of the lower contact 530 arranged on the first to third element isolation regions STI1-STI3 and facing the first gate structure 510 may have a curved shape which is convexly formed toward the direction of facing the first gate structure 510.

In addition, a sidewall of the lower contact 530 arranged on the first to third element isolation regions STI1-STI3 and facing the second gate structure 520 may have a curved shape which is convexly formed toward the direction of facing the second gate structure 520.

Sidewalls of first to third upper contacts 541, 542, and 543 facing the first and second gate structures 110 and 120, respectively, may each have a curved shape convexly formed. In some example embodiments, the first to third upper contacts 541, 542, and 543 may each have a rectangular shape like the semiconductor device illustrated in FIG. 13.

As described above, embodiments may provide a semiconductor device in which a width of a lower contact arranged on an active region is narrower than a width of a lower contact arranged on an element isolation region, which may help to enhance reliability. Embodiments may also provide a semiconductor device in which a width of an upper contact on an element isolation region is narrower than a width of a lower contact, which may help to enhance reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
 a first active region that extends on a substrate in a first direction;
 a second active region that extends on the substrate in the first direction and in parallel with the first active region;
 an element isolation region between the first active region and the second active region;
 a first gate structure that extends in a second direction different from the first direction, and intersects the first and second active regions;
 a second gate structure that extends in the second direction and intersects the first and second active regions, the second gate structure being spaced apart from the first gate structure in the first direction;
 a lower contact that includes, between the first gate structure and the second gate structure, a first portion arranged on the first active region, a second portion arranged on the element isolation region, and a third portion arranged on the second active region; and
 an upper contact on the second portion of the lower contact, the upper contact having a width in the first direction that is greater than a width of the first portion of the lower contact in the first direction.

2. The semiconductor device as claimed in claim 1, wherein the width of the upper contact in the first direction is greater than a width of the third portion of the lower contact in the first direction.

3. The semiconductor device as claimed in claim 2, wherein the width of the first portion of the lower contact in the first direction is substantially same as the width of the third portion of the lower contact in the first direction.

4. The semiconductor device as claimed in claim 1, wherein the lower contact extends in the second direction and intersects the first and second active regions.

5. The semiconductor device as claimed in claim 1, wherein a width of the first portion of the lower contact in the first direction is narrower than the width of the second portion of the lower contact in the first direction.

6. The semiconductor device as claimed in claim 1, wherein a width of the second portion of the lower contact in the first direction is greater than the width of the upper contact in the first direction.

7. The semiconductor device as claimed in claim 1, wherein the lower contact on the element isolation region is convexly formed so as to protrude toward a direction in which the first gate structure is positioned.

8. A semiconductor device, comprising:
a first active region that extends on a substrate in a first direction;
a second active region that extends on the substrate in the first direction and in parallel with the first active region;
an element isolation region beside the second active region in opposition to the first active region;
a gate structure that extends in a second direction different from the first direction, and intersects the first and second active regions;
a lower contact that extends in the second direction in parallel with the gate structure, and intersects the first and second active regions; and
an upper contact on the lower contact,
wherein the lower contact includes a first portion arranged on the second active region and a second portion arranged on the element isolation region,
wherein the upper contact is on the second portion of the lower contact,
wherein the upper contact has a width in the first direction that is greater than a width of the first portion of the lower contact in the first direction.

9. The semiconductor device as claimed in claim 8, wherein a width of the first portion of the lower contact in the first direction is narrower than the width of the second portion of the lower contact in the first direction.

10. The semiconductor device as claimed in claim 8, wherein a width of the second portion of the lower contact in the first direction is greater than the width of the upper contact in the first direction.

11. The semiconductor device as claimed in claim 8, wherein the lower contact on the element isolation region is convexly formed so as to protrude toward a direction in which the gate structure is positioned.

12. A semiconductor device, comprising:
a first active region that extends along a substrate in a first direction;
a second active region that extends along the substrate in the first direction;
an element isolation region that separates the first active region from the second active region;
a first gate structure that extends in a second direction across the first active region, the element isolation region, and the second active region;
a lower contact that extends in the second direction across the first active region, the element isolation region, and the second active region, an uppermost extent of the lower contact having a first width crossing the first active region in the first direction;
an upper contact having a lower portion contacting the lower contact, the upper contact having an uppermost extent having a second width in the second direction, the second width being greater than the first width; and
a second gate structure that extends in the second direction across the first active region, the element isolation region, and the second active region, the upper and lower contacts being between the first gate structure and the second gate structure.

13. The semiconductor device as claimed in claim 12, wherein the uppermost extent of the lower contact has the first width crossing the second active region.

14. The semiconductor device as claimed in claim 13, wherein the uppermost extent of the lower contact has a third width, greater than the first width, crossing the element isolation region.

15. The semiconductor device as claimed in claim 12, wherein a first distance in the first direction between the first gate structure and the uppermost extent of the lower contact along the first active region is greater than a second distance in the first direction between the first gate structure and the uppermost extent of the lower contact along the element isolation region.

16. The semiconductor device as claimed in claim 15, wherein, in the first direction along the element isolation region, the uppermost extent of the upper contact is narrower than the uppermost extent of the lower contact.

17. The semiconductor device as claimed in claim 12, wherein the lower contact is tapered in a third direction normal to the substrate, such that the uppermost extent of the lower contact is wider than a corresponding portion of a lowermost extent of the lower contact.

18. The semiconductor device as claimed in claim 17, wherein the uppermost extent of the lower contact is wider in the first and second directions than the corresponding portion of a lowermost extent of the lower contact.

19. The semiconductor device as claimed in claim 17, wherein the upper contact is tapered in a third direction normal to the substrate.

20. The semiconductor device as claimed in claim 12, wherein, in a plane that contains the first and second directions, the upper contact does not overlap first active region and does not overlap the second active region.

* * * * *